United States Patent
Nakamuta et al.

(10) Patent No.: US 7,368,962 B2
(45) Date of Patent: May 6, 2008

(54) CLOCK SUPPLY DEVICE

(75) Inventors: Koji Nakamuta, Kawasaki (JP);
Yoshito Koyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 52 days.

(21) Appl. No.: 11/542,174

(22) Filed: Oct. 4, 2006

(65) Prior Publication Data

US 2007/0229128 A1    Oct. 4, 2007

(30) Foreign Application Priority Data

Mar. 28, 2006 (JP) .............................. 2006-088341

(51) Int. Cl.
*H03L 7/06* (2006.01)

(52) U.S. Cl. ........................ 327/156; 327/147

(58) Field of Classification Search ..................... None
See application file for complete search history.

(56) References Cited

U.S. PATENT DOCUMENTS

| | | | | |
|---|---|---|---|---|
| 4,733,341 A | * | 3/1988 | Miyazawa | 363/71 |
| 5,151,896 A | * | 9/1992 | Bowman et al. | 370/401 |
| 5,153,824 A | * | 10/1992 | Lalanne et al. | 700/79 |
| 6,252,444 B1 | * | 6/2001 | Lee | 327/156 |
| 6,570,454 B2 | * | 5/2003 | Skierszkan | 331/2 |
| 6,611,159 B1 | * | 8/2003 | Milano et al. | 327/147 |
| 7,006,590 B2 | * | 2/2006 | Skierszkan et al. | 375/376 |
| 7,076,065 B2 | * | 7/2006 | Sherman et al. | 380/263 |
| 7,239,651 B2 | * | 7/2007 | Gilsdorf | 370/503 |
| 2004/0164776 A1 | * | 8/2004 | Zampetti et al. | 327/156 |

FOREIGN PATENT DOCUMENTS

JP     2004-229020     8/2004

* cited by examiner

*Primary Examiner*—Cassandra Cox
(74) *Attorney, Agent, or Firm*—Staas & Halsey LLP

(57) ABSTRACT

Each clock supply unit comprises an inter-unit synchronization portion which operates when the clock supply unit is acting as a standby unit, using a clock signal from a DPLL of a unit which is active as reference, to apply a predetermined phase difference to the output clock signal of the DPLL of the unit to cause synchronization with the output clock signal of the DPLL of the active unit.

5 Claims, 8 Drawing Sheets

CLOCK SUPPLY DEVICE

CROSS REFERENCE TO RELATED APPLICATION

This application is based upon, and claims the benefit of priority from, the prior Japanese Patent Application No. 2006-88341, filed on Mar. 28, 2006, the entire contents of which being incorporated herein by reference.

BACKGROUND OF THE INVENTION

1. Field of the Invention

The present invention relates to a clock supply device which supplies a reference clock to a transmission device, such as an optical transmission device or mobile communications device, which is provided in a digital synchronous network. In particular, the present invention relates to a clock supply device which comprises a plurality of clock supply boards which generate clock signals based on an external reference clock supplied from an upper level of the digital synchronous network, whereby these clock supply boards create a redundant configuration.

2. Description of the Related Art

A reference clock source which act as a reference is provided in the uppermost layer of a digital synchronous network, and a standard cesium oscillator is generally used as this reference clock source. Each transmission device within the synchronous network comprises a unit (hereinafter called a "system clock supply device") which generates a system clock to be used within that device, based on a clock which is supplied from that reference clock source.

The system clock supply device could be considered to be the heart of a transmission device, and a breakdown in the system clock would cause an immediate system failure. For that reason, the system clock supply device is made to have a redundant configuration, in order to provide stable service in a communications device or the like which could cause serious trouble by failing.

A plurality of clock supply units is provided in a redundant system clock supply device; one of these is used to supply the current clock signal as an active unit (ACT unit) and the other clock supply unit acts as a standby unit (STBY unit).

An example of the redundant configuration of a system clock supply device of the prior art is shown in FIG. 1.

A system clock supply device 1 comprises a plurality of clock supply units 10 and 20 which each generate a clock signal based on an external reference clock, and the redundant configuration is implemented by using one unit as the active unit while another unit is on standby as a standby unit.

The first clock supply unit 10 comprises a reference clock selector 11 which selects one clock signal, with which that unit 10 is synchronized, from external reference clock signals which are supplied from N lines from a clock supply source of a higher level; a digital phase locked loop circuit (DPLL) 12 which generates a predetermined clock signal based on that external reference clock; and an analog phase locked loop circuit (APLL) 13 which generates a clock signal of a frequency higher than that of the clock signal generated by the DPLL 12. The second clock supply unit 20 has a structure similar to that of the first clock supply unit 10, that is, the second clock supply unit 20 comprises a reference clock selector 21, a DPLL 22, and an APLL 23.

The first clock supply unit 10 also comprises an output clock selector 15. The output clock selector 15 selects either a clock signal from the DPLL 12 of the self unit or a clock signal from the DPLL 22 of the second clock supply unit 20, which has been input thereto from the second clock supply unit 20 through back-board wiring B2, as the output clock signal which the first clock supply unit 10 outputs, for input to a distribution PLL 16.

Note that, in this document, the clock signal which has been input from the second clock supply unit 20 through the back-board wiring B2 to the first clock supply unit 10 is called the "partner clock signal" in descriptions relating to the first clock supply unit 10.

The distribution PLL 16 inputs the clock signal which has been selected by the output clock selector 15, generates a clock signal synchronized with that clock signal, and outputs that to an electronic device 2.

When the output clock selector 15 has switched the output clock signal which is output from the first clock supply unit 10 from one of the clock signal from the DPLL 12 and the partner clock signal to the other, the distribution PLL 16 smoothes any sudden phase change in the output clock signal caused by any phase difference between the two clock signals.

If a problem occurs in the active unit which is currently being used, the distribution PLL 16 also fulfills the role of continuing the supply of the clock signal to the electronic device 2 in the later stage by self-oscillation during the short period of time until the switchover operation of the output clock selector 15 is completed, even if the input of the clock signal from the DPLL of the active unit has ceased.

Note that the second clock supply unit 20 has a similar configuration to that of the first clock supply unit 10, that is, the second clock supply unit 20 comprises an output clock selector 25 and a distribution PLL 26. The clock signal from the DPLL 12 of the clock supply unit 10 is input into the second clock supply unit 20 through back-board wiring B1.

Note that, in this document, the clock signal which has been input from the first clock supply unit 10 through the back-board wiring B1 to the second clock supply unit 20 is called the "partner clock signal" in descriptions relating to the second clock supply unit 20.

In this case, the expression "the clock signal from the", within phrases such as "the clock signal from the DPLL 12" and "the clock signal from the DPLL of the self unit" which are used in this document and in the descriptions of the claims, is used to indicate which of the clock supply units has the DPLL which generates the clock signal in which the target clock signal originates. For example, the target clock signal in the above expression may be the clock signal generated by that DPLL directly, a clock signal generated by a later-stage APLL based on the clock signal generated by the DPLL directly, and a clock signal which is one of those signals which has been delayed by a known delay line.

To indicate the clock signal which is generated by the DPLL directly, on the other hand, expressions such as "the clock signal generated by" the DPLL 12 or "the output clock signal of" the DPLL 22 of the second clock supply unit 20.

The system clock supply device 1 performs the operation of switching one of the clock supply units 10 and 20 from being the active unit to being the standby unit, and the other from being the standby unit to being the active unit, by means of the two output clock selectors 15 and 25.

When the first clock supply unit 10 is the active unit and the second clock supply unit 20 is the standby unit, as shown in FIG. 1 by way of example, the clock signal from the DPLL 12 of the first clock supply unit 10 is output from the clock supply unit 10 while the partner clock signal from the DPLL 12 of the first clock supply unit 10 is also output from the second clock supply unit 20.

Conversely, when the second clock supply unit 20 is the active unit and the first clock supply unit 10 is the standby unit, the clock signal from the DPLL 22 of the second clock supply unit 20 is output from the clock supply unit 20 while the partner clock signal from the DPLL 22 of the second clock supply unit 20 is also output from the first clock supply unit 10.

To ensure that there is no phase difference between the clock signals supplied from the two units 10 and 20 due to a delay in the back-board wiring between the first clock supply unit 10 and the second clock supply unit 20 delay lines 14 and 24, which have delays corresponding to the delays of the back-board wiring, are provided between the APLL 13 of the first clock supply unit 10 and the output clock selector 15 and between the APLL 23 of the second clock supply unit 20 and the output clock selector 25, respectively.

The switchover operations of the two output clock selectors 15 and 25 is controlled by an active-system switching signal which is generated by an active-system switcher portion 40 provided within the system clock supply device 1 or provided in an external device at a level higher than that of the system clock supply device 1. The active-system switcher portion 40 detects an abnormality in the output clock of the active unit, for example, then automatically switches the state of the unit which was being used as the active unit from active state to standby state and switches the state of the unit which was on standby as the standby unit from standby state to active state. The active-system switcher portion 40 also can also be set to do this switchover in answer to a manual operation by the operator.

The electronic device 2 which uses the clock signal supplied from the system clock supply device 1 comprises a unit selector 31, which selects one of the two clock supply units 10 and 20 as the active unit and receive the clock signal supplied by the selected unit, and a PLL 32 which generates a clock signal to be used within that device 2, based on the clock signal which is received from the thus-selected active unit.

SUMMARY OF THE INVENTION

The system clock supply device 1, having a redundant configuration as described above, often has problems relating to disturbances in the clock signal which occur during the switching of the active system between the units 10 and 20, in other words, due to phase fluctuations.

This description now turns to phase fluctuations in the supplied clock signal which occur during the switching of the active unit, with reference to FIG. 2.

Assume that the clock supply unit 10 is currently being switched from the active unit to the standby unit and the clock supply unit 20 is currently being switched from the standby unit to the active unit. During this time, the output clock selector 25 and the unit selector 31 switch over.

This description first looks at the switchover by the unit selector 31. As the signal at the position C of FIG. 1 is given the same delay by the delay line 14 as the phase delay caused in the signal at the position D by the back-board wiring B1, the phase difference between the signals at the positions C and D is suppressed. For that reason, there is little disturbance in the clock signal created by the switchover of the unit selector 31, as shown in FIG. 2.

The description next looks at the switchover by the output clock selector 25. As the phase difference between the clock signal from the DPLL 12 of the unit 10 and the clock signal from the DPLL 22 of the unit 20 is not adjusted, the phase difference between the signals at the positions A and B of FIG. 1 is undetermined and a phase difference of up to one cycle of the clock frequency could be generated. For that reason, there is a large amount of fluctuation in the phases of the clock signals created by the switchover by the output clock selector 25, as shown in FIG. 2.

As the distribution PLL 26 which inputs the clock signal detected by the output clock selector 25 is usually set to have a low cut-off frequency, the tendency towards phase fluctuations is weaker than during the switching of the unit selector 31. However, if there is a large amount of fluctuation, it could cause erroneous operation in the electronic device 2 during a switchover of the active system.

In the light of the above-described problem, the present invention was devised with the objective of providing a clock supply device having a redundant configuration which comprises a plurality of clock supply units, each having a DPLL which generates a clock signal based on an external reference signal, such that one of said clock supply units acts as an active unit and another of said clock supply units acts as a standby unit; wherein phase fluctuations in the supplied clock signal caused during the switchover of the active unit are reduced.

To achieve the above-described objective, each clock supply unit in accordance with the present invention causes synchronization of the output clock signal of the DPLL of the self unit to the output clock signal of the DPLL of the active unit, with a predetermined phase difference therebetween, when the self unit is acting as the standby unit.

During that time, the standby unit inputs the clock signal from the DPLL of the active unit (partner clock signal). As the amount of signal delay due to each component of the circuits within these clock supply units can be determined beforehand by experimentation or the like, this partner clock signal can be used as reference, the output clock signal of the DPLL of the standby unit can be synchronized to the output clock signal of the DPLL of the active unit, with a predetermined phase difference therebetween, and also this predetermined phase difference can be adjusted.

Adjusting the phase difference between the output clock signal of the DPLL of the standby unit and the output clock signal of the DPLL of the active unit makes it possible to reduce the phase difference between the output clocks which are output from the active unit and the standby unit, and also reduce any phase fluctuations in the supplied clock signal when the active unit is switched over.

For that reason, a clock supply device in accordance with the present invention has a redundant configuration which comprises a plurality of clock supply units, each having a DPLL which generates a clock signal based on an external reference signal, wherein an inter-unit synchronization portion as described below is provided in each clock supply device.

This inter-unit synchronization portion operates when the self unit is the standby unit, to cause synchronization of the output clock signal of the DPLL of the self unit to the output clock signal of the DPLL of the active unit, with a predetermined phase difference therebetween, with reference to the partner clock signal which is input from said active unit.

The DPLL provided in the clock supply unit comprises a phase comparison portion which outputs a difference signal between a specified convergence phase difference and a phase difference, wherein the latter phase difference is a difference between the phase of an input reference clock signal and the phase of the output clock signal of the DPLL; and an oscillation portion which generates a clock signal to be output by the DPLL, while varying the frequency of the clock signal such that the value of the difference signal becomes smaller.

The inter-unit synchronization portion may cause synchronization of the output clock signal of the DPLL of the self unit with the output clock signal of the DPLL of the active unit, with the predetermined phase difference therebetween, by modifying the specified value of the convergence phase difference during the switchover of the reference clock signal which is input to the DPLL from the external reference clock signal to the partner clock signal.

For that purpose, the inter-unit synchronization portion comprises a clock signal switching portion which switches the reference clock signal which is input to the DPLL from the external reference clock signal to the partner clock signal, and a convergence phase difference modification portion which modifies the specified value of the convergence phase difference when the reference clock signal which is input to the DPLL is switched.

The convergence phase difference modification portion may specify the convergence phase difference from a plurality of different fixed values which have been determined beforehand, such as a specified value which is used when the self unit is the active unit and another specified value which is used when the self unit is the standby unit.

Alternatively, if the clock supply unit is configured to select either the clock signal from the DPLL of the self unit or the partner clock signal for output to the exterior as described above, the clock supply unit further comprises a phase difference detection portion which detects an output phase difference which is the phase difference between the clock signal from the DPLL of the self unit and the partner clock signal, where the specified value of the convergence phase difference is modified by the convergence phase difference modification portion such that the output phase difference becomes smaller.

Modifying the specified value of the convergence phase difference makes it possible to avoid any problems caused by fixing the convergence phase difference. For example, since there are variations in the amount of signal delay between the various components within the clock supply unit, there will be slight differences in the suitable specified value for the convergence phase difference. However, making the convergence phase difference variable makes it possible to set a convergence phase difference which allows for those variations.

In addition, the clock supply unit comprises a cut-off frequency modification portion which increases the cut-off frequency of the DPLL of the self unit when the self unit is the standby unit, in comparison to that when the self unit is the active unit. Increasing the cut-off frequency of the DPLL makes it possible to increase conformity with the partner clock.

BRIEF DESCRIPTION OF THE DRAWINGS

The present invention will be more clearly understood from the description as set below with reference to the accompanying drawings, wherein.

DESCRIPTION OF THE PREFERRED EMBODIMENTS

Figure 1:
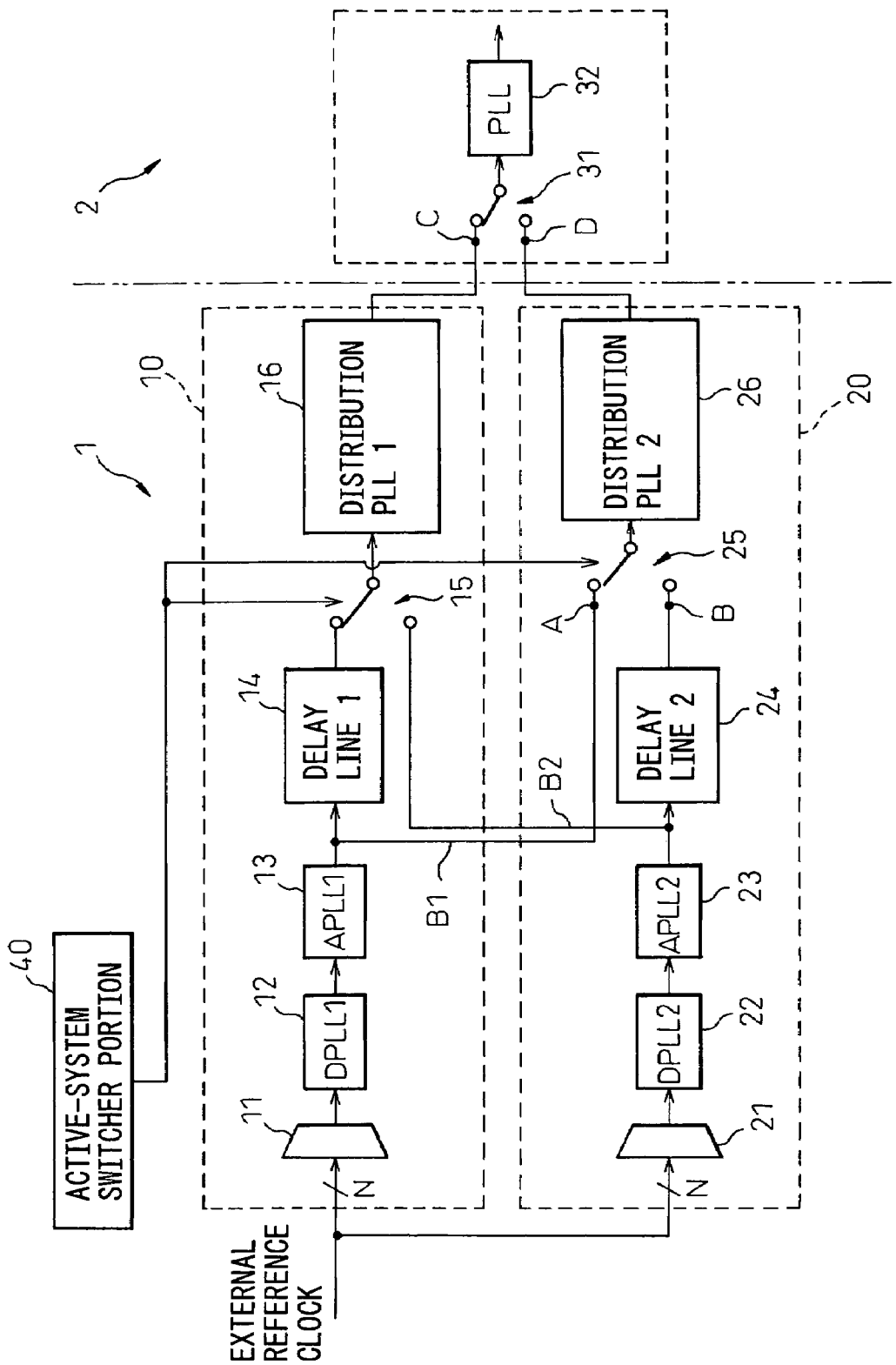
FIG. 1 is a block diagram of an example of a prior-art system clock supply device having a redundant configuration.
Figure 2:
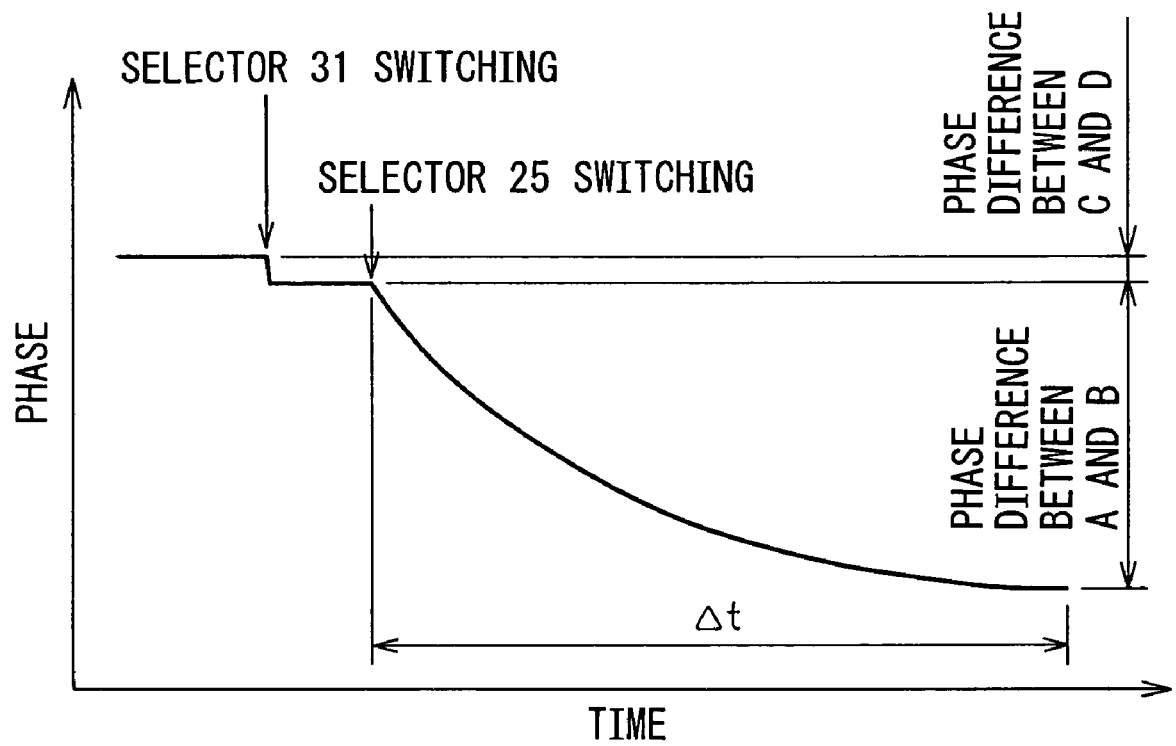
FIG. 2 shows phase fluctuations in the supplied clock signal which occur during the switching of the active unit.
Figure 3:
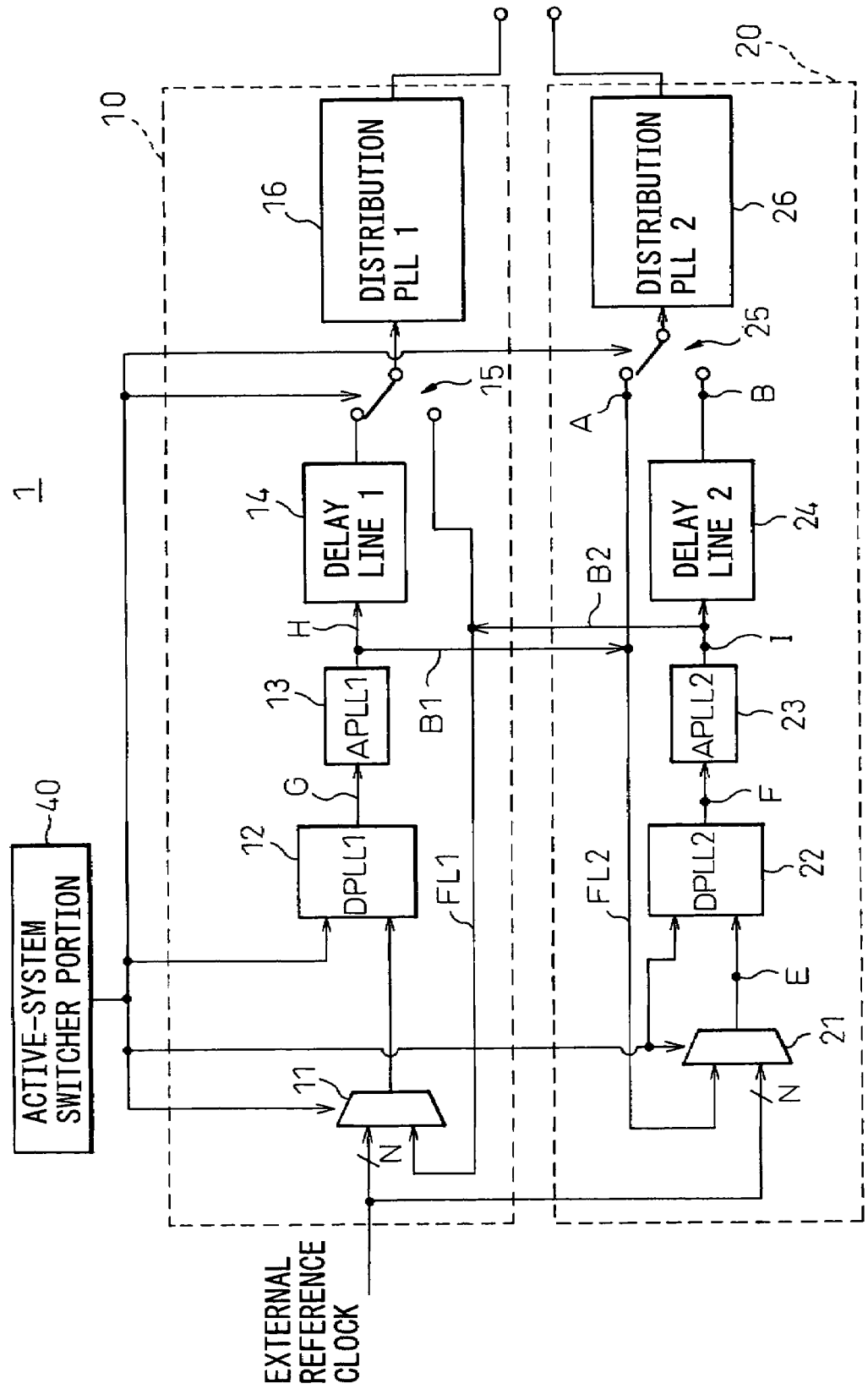
FIG. 3 is a block diagram of the basic configuration of a first embodiment of a system clock supply device in accordance with the present invention.

Preferred embodiments of the present invention will be described in detail below while referring to the attached figures. A block diagram of the basic configuration of a first embodiment of a system clock supply device in accordance with the present invention is shown in FIG. 3. The components which are similar to components of the system clock supply device of the prior art shown in FIG. 1 are denoted by the same reference numbers. Descriptions of similar functions are omitted.

As shown in figure, the first clock supply unit 10 inputs a clock signal which is generated by the APLL 23, based on the output clock of the DPLL 22 of the second clock supply unit 20 (in other words, "the clock signal from the DPLL 22" to follow the terminology convention described above) as the partner clock signal through the back-board wiring B2. In addition, the partner clock signal is fed back and input to the reference clock selector 11 by a feedback line FL1.

When the clock supply unit 10 is the active unit, the reference clock selector 11 inputs an external reference clock signal which is supplied from a clock supply source in an upper level to the DPLL 12 as a reference clock, in accordance with an active-system switching signal which is issued by the active-system switcher portion 40. When the clock supply unit 10 is the standby unit, the reference clock selector 11 inputs the partner clock signal which is input through the feedback line FL1 to the DPLL 12 as the reference clock, in accordance with an active-system switching signal which is issued by the active-system switcher portion 40.

The active-system switching signal from the active-system switcher portion 40 is also input to the DPLL 12. This modifies the operational settings depending on whether the clock supply unit 10 is the active unit or the standby unit, to ensure that when the clock supply unit 10 is the standby unit, that output clock is synchronized to the output clock of the DPLL 22 of the second clock supply unit 20 with a predetermined phase difference therebetween.

Similarly, the clock signal generated by the APLL 13 of the first clock supply unit 10, in other words, "the clock signal from the DPLL 12", is also input as the partner clock signal through the back-board wiring B1 to the second clock supply unit 20. The partner clock signal is also fed back and input to the reference clock selector 21 through a feedback line FL2.

When the clock supply unit 20 is the active unit, the reference clock selector 21 inputs the external reference clock signal which is supplied from the clock supply source in the upper level as the reference clock to the DPLL 22, in accordance with the active-system switching signal from the active-system switcher portion 40. When the second clock supply unit 20 is the standby unit, the reference clock selector 21 inputs the partner clock signal which is input through the feedback line FL2 to the DPLL 22 as the reference clock, in accordance with an active-system switching signal which is issued by the active-system switcher portion 40.

The active-system switching signal from the active-system switcher portion 40 is also input to the DPLL 22.

Figure 4:
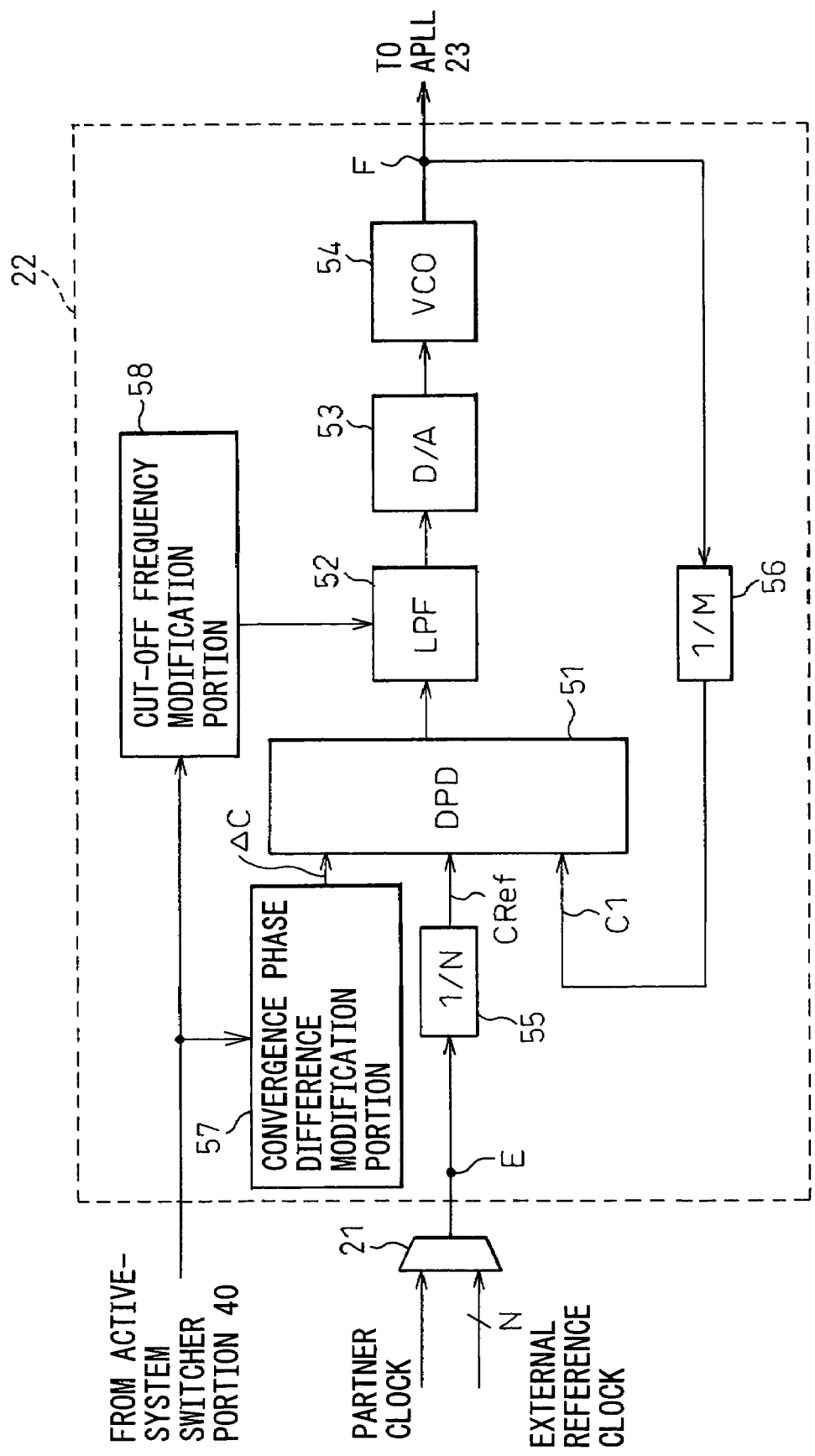
FIG. 4 is a block diagram of the basic configuration of the DPLL of FIG. 3.

A block diagram of the basic configuration of the DPLL 22 of FIG. 3 is shown in FIG. 4. As the DPLL 12 provided in the first clock supply unit 10 has the same configuration, a description thereof is omitted.

The DPLL 22 uses a digital phase comparator (DPD) 51 to compare the phase of a clock signal C1, which is the output clock from a voltage control oscillator (VCO) 54 which has been divided by a division ratio 1/M by a 1/M divider 56, and the phase of a clock signal CRef, which is the reference clock signal which has been divided by 1/N by a 1/N divider 55. The output of the DPD 51 is used for negative feedback control of the VCO 54 as an error signal.

The DPD 51 counts internal clocks from a predetermined reference time (such as the timing of the rising edge) of the clock signal CRef which is the reference clock signal divided by 1/N divider 55 until a predetermined reference time of the clock signal C1 which is the output clock of the VCO 54 divided by 1/M divider 56. The difference between a set convergence phase difference $\Delta C$ and this count is output as an error signal. Note that this convergence phase difference $\Delta C$ is called the "DPD count".

Therefore, the frequency of the output clock of the VCO 54 can be controlled by using this error signal to exert negative feedback control on the VCO 54 in accordance with the phase difference between the clock signal C1 and the clock signal Cref such that the difference between the count and the convergence phase difference $\Delta C$ becomes smaller.

The DPLL 22 comprises a low-pass filter (LPF) 52 which filters the low band of the phase difference signal from the DPD 51 and a digital/analog converter (D/A) 53 which converts the digital signal from the LPF 52 into an analog signal to obtain a control voltage for the VCO 54.

Figure 5:
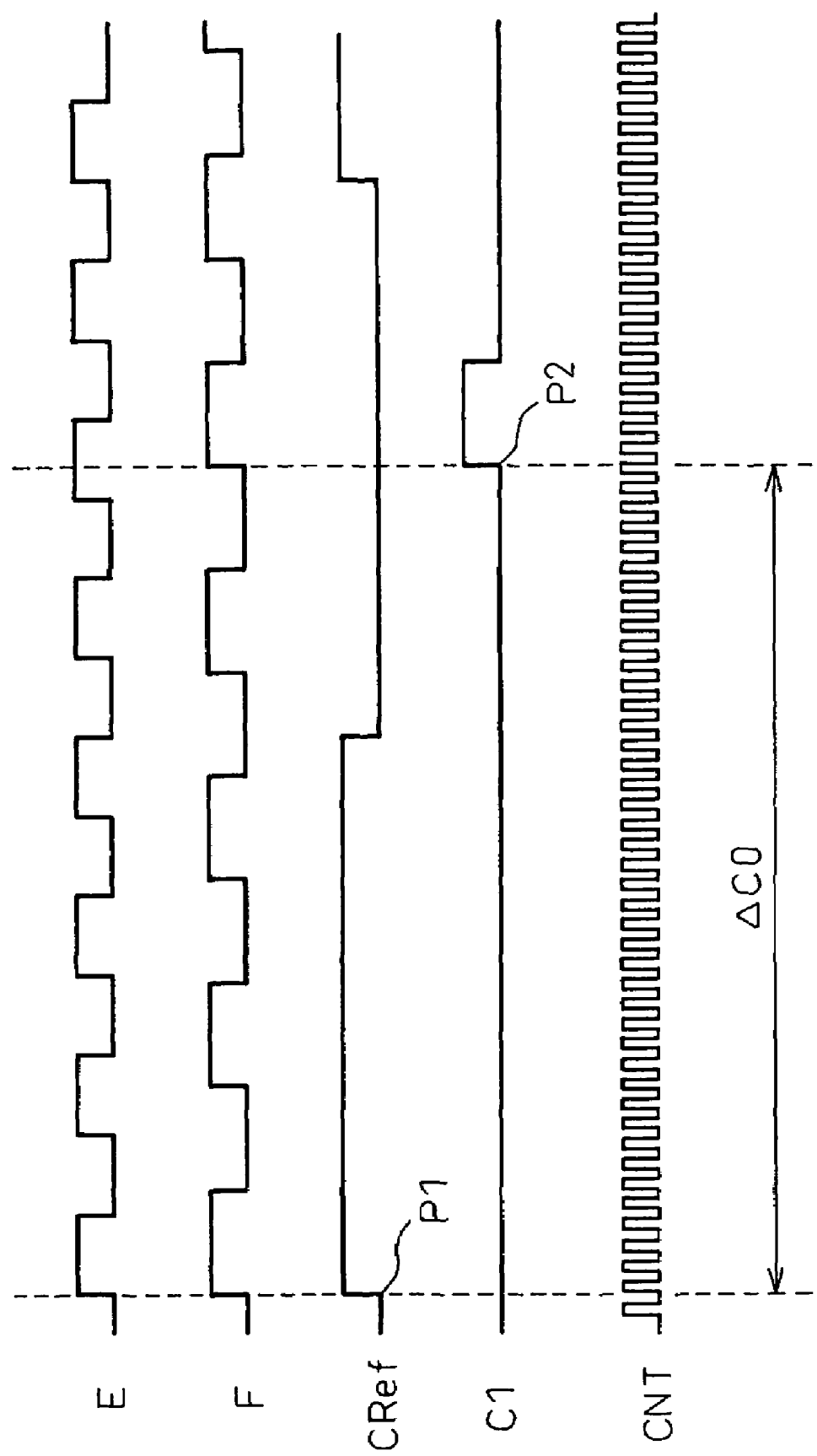
FIG. 5 is a timing chart of signals of various positions of a clock supply unit which is operating as the active unit.

A timing chart of signals of various parts of the second clock supply unit 20 when operating as the active unit is shown in FIG. 5. Signals E, F, CRef, and C1 in FIG. 5 are the signals at the positions E, F, CRef, and C1 shown in FIG. 4.

In this case, the signal E is the signal selected by the reference clock selector 21, the signal F is the output clock signal of the VCO 54, the signal CRef is the signal E which has been divided by the division ratio 1/N and input to the DPD 51, the signal C1 is the signal F which has been divided by the division ratio 1/M and input to the DPD 51, and a signal CNT is a counter clock within the DPD 51 which is used for timing from a reference time P1 of the signal CRef to a reference time P2 of the clock signal C1. When the second clock supply unit 20 is the active unit, the reference clock selector 21 selects an external reference clock signal as the reference clock signal, so that the signal E becomes the external reference clock signal.

Note that the mode of the timing charts of the various positions of the clock supply units 10 and 20 shown in FIG. 5, and also in FIG. 6 which will be described below, will differ with the circuit configuration of the clock supply units 10 and 20, so different values are set for a convergence phase difference $\Delta C0$ and a convergence phase difference $\Delta CV$ used during standby (as will be described below) depending on the circuit configurations.

For example, the timing charts would differ depending on how the phase relationships between the phases of the output clock of the DPLLs 12 are 22 and the reference clock such as an external reference clock are locked. Similarly, the timing chart of FIG. 6 would differ depending on how the phase relationships between the input-output clocks of the APLLs 13 and 23 are locked.

Figure 6:
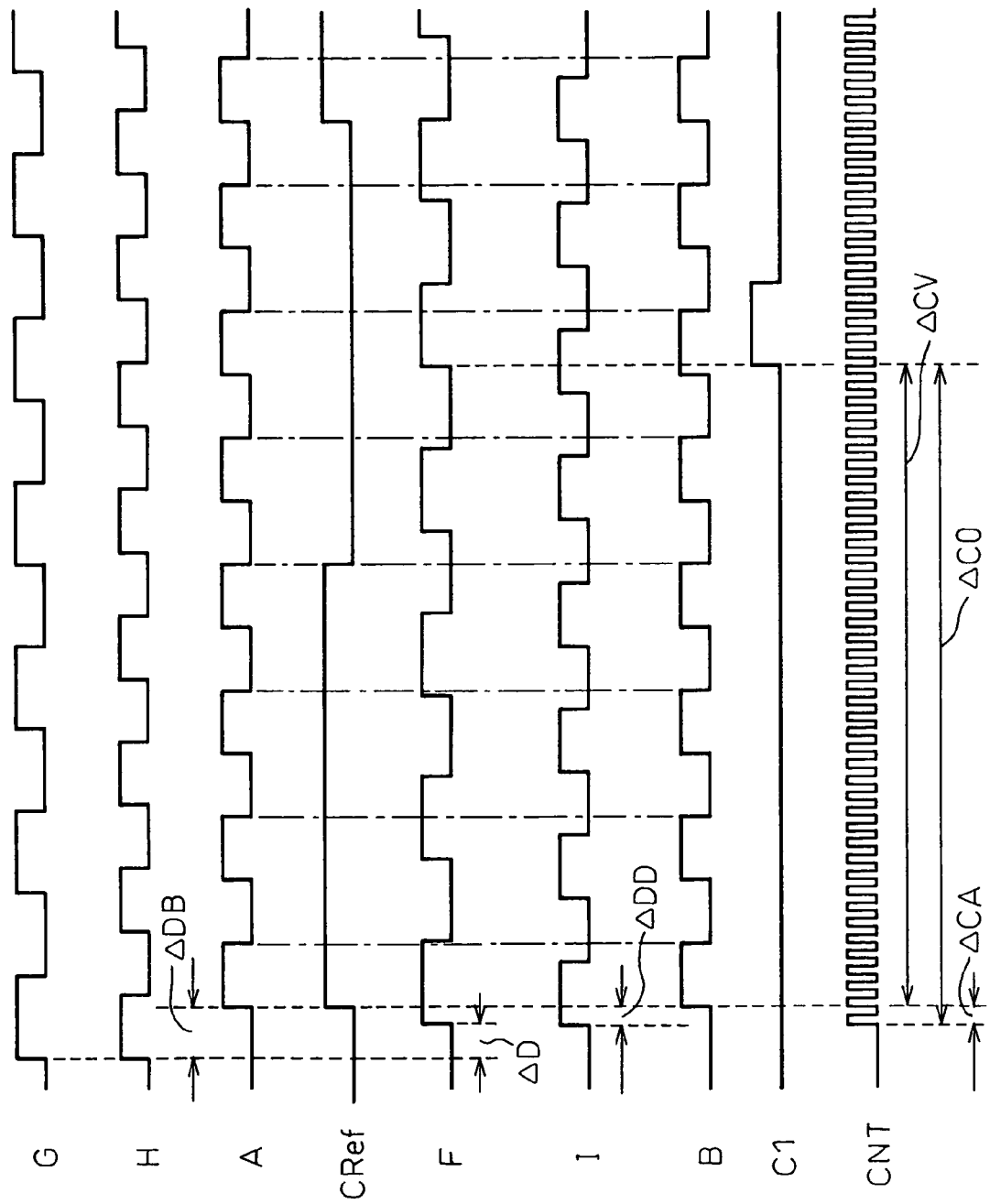
FIG. 6 is a timing chart of signals of various positions of a clock supply unit which is operating as the standby unit.

To simplify the descriptions, therefore, FIGS. 5 and 6 show examples of timing charts when the phases of the output clocks of the DPLLs 12 and 22 are locked so that the rise timings thereof coincide with the rise timing of the reference clock in each predetermined cycle, and also the phases of the output clocks of the APLLs 13 and 23 are locked so that the rise timings of the output clock and the input clock of each of the APLLs coincide with each other in each predetermined cycle.

As shown in the figures, if the convergence phase difference used when the second clock supply unit 20 is the active unit is set to $\Delta C0$, an output clock signal F of the VCO 54 is controlled in such a manner that it has a specific phase relationship with respect to an external reference clock E which is determined in accordance with $\Delta C0$. In other words, this output clock signal F is controlled in such a manner that the clock signal C1, which is this output clock signal F divided by the division ratio 1/M, has a phase difference $\Delta C0$ with respect to the signal CRef which is the external reference clock divided by the division ratio 1/N.

In this case, the convergence phase difference $\Delta C0$ which is used during operation as the active unit is set to a magnitude such that the DPD count, which is the count of the internal clocks from the reference time P1 of the signal Cref to the reference time P2 of the signal C1, can take values of a suitable dynamic range. This enable highly precise detection of the phase difference between the signal CRef and the signal C1, and enables favorable control of the phase difference between the output clock signal F of the VCO 54 and the external reference clock signal E.

A timing chart of signals of various positions of the second clock supply unit 20 when operating as the standby unit is shown in FIG. 6. Signals G, H, A, CRef, F, I, B, and C1 in FIG. 6 are the signals at the positions G, H, A, CRef, F, I, B, and C1 shown in FIGS. 3 and 4.

In this case, the signal G in FIG. 6 is the output clock signal of the DPLL 12 of the first clock supply unit 10 which is the active unit, the signal H is the output clock signal of the APLL 13 of the first clock supply unit 10, the signal A is the partner clock signal in the second clock supply unit 20, and the signal Cref is the signal A divided by the division ratio 1/N, which is input to the DPD 51.

Similarly, the signal F is the output clock signal of the VCO 54 within the DPLL 22 of the second clock supply unit 20, the signal I is the output clock signal of the APLL 23, the signal B is a delay clock signal obtained by delaying the signal I by the delay line 24, the signal C1 is the signal F divided by the division ratio 1/N and input to the DPD 51, and a signal CNT is a counter clock within the DPD 51.

Consider the removal of any phase difference between the signals A and B which are input to the distribution PLL 26 provided in the output stage of the second clock supply unit 20, when the second clock supply unit 20 is currently the standby unit, to cause synchronization therebetween.

If the phase difference between the signals A and B is removed, there are no phase fluctuations in the signal which is input to the distribution PLL 26 when the second clock supply unit 20 switches from being the standby unit to being the active unit, even when the signal switches from the partner clock signal A from the DPLL 12 of the unit 10 to the delay clock signal B.

As shown in FIG. 6, a delay amount $\Delta DD$ of the delay clock signal B with respect to the output signal I of the APLL 23 of the second clock supply unit 20 is the amount of delay due to the delay line 24, which is a known value.

Therefore, the phase difference between the delay clock signal B and the partner clock signal A can be removed by inputting the partner clock signal A to the DPLL 22 of the unit 20 as the reference clock signal and also by modifying the value of the convergence phase difference to be set in the DPD 51 within the DPLL 22 from ΔC0 for active operation to ΔCV, which is faster than ΔC0 by the delay amount ADD, for standby operation.

To achieve that objective, each of the clock supply units 10 and 20 comprises a convergence phase difference modification portion 57, as shown in FIG. 4. The convergence phase difference modification portion 57 either sets the convergence phase difference ΔC0 for active operation in the DPD 51 when the self unit is the active unit, or sets the convergence phase difference ΔCV for standby operation, which is ΔC0 plus the adjustment ΔCA, in the DPD 51 when the self unit is the standby unit, in accordance with the active-system switching signal from the active-system switcher portion 40.

These convergence phase values ΔC0, ΔCV, and ΔCA could be determined previously, by experiment or the like, and stored in firmware in each of the clock supply units 10 and 20.

Note that in such a case, the partner clock signal A has a delay of ΔDB with respect to the output signal H of the APLL 13 of the first clock supply unit 10, due to the back-board wiring B1, and this delay ΔDB can also be determined beforehand, by experiment. In addition, the phase relationship between the output signal G of the DPLL 12 which is input to the APLL 13 and the output signal H of the APLL 13 is also determined beforehand. Similarly, the phase relationship between the output signal F of the DPLL 22 of the second clock supply unit 20 and the output signal I of the APLL 23 is also determined beforehand.

As described above, this modification of the convergence phase difference ΔC and adjustment of the phase difference between the partner clock signal A and the output signal I of the APLL 23 means that the output clock signal of the DPLL 22 of the second clock supply unit 20 which is the standby unit is synchronized with the output clock of the DPLL 12 of the first clock supply unit 10 which is the active unit, with a predetermined phase difference (ΔD in FIG. 6) therebetween. This means that the convergence phase difference modification portion 57 and the reference clock selector 21 form an inter-unit synchronization portion as defined in the claims of the present application.

Note that, if the oscillation frequency of the APLL 13 and the APLL 23 differs from the frequency of the external reference clock signal, the configuration could be such that the switchover of the division ratio of the 1/N divider 55 depends on whether the self unit is the active unit or the standby unit, as specified by the active-system switchover signal.

Returning to FIG. 4, each of the clock supply units 10 and 20 comprises a cut-off frequency modification portion 58 which modifies the cut-off frequency of the LPF 52 within the corresponding DPLL, in order to modify the cut-off frequency of the corresponding DPLL 12 or 22 depending on whether the self unit is the active unit or the standby unit, as determined by the active-system switchover signal.

The cut-off frequency modification portion 58 improved the conformity with the partner clock which is input to the DPLL 12 or 22 as the reference clock, by increasing the cut-off frequency during standby to greater than that used during active operation, by means such as modifying the number of taps of the LPF 52 which is implemented by a digital filter.

The LPF 52 within the DPLL usually sets a low cut-off frequency in order to prevent any sudden fluctuations in the phase of the clock signal which is output to the later stages. However, while this unit is on standby, the output clock signal of the DPLL is not supplied from the system clock supply device 1 to the later stages and thus the cut-off frequency could be increased during that time. In such a case, the cut-off frequency modification portion 58 can make the cut-off frequency of the DPLL higher when the self unit is the standby unit, to rapidly cancel any phase difference between the delay clock signal B and the partner clock signal A.

This also improves the conformity of the delay clock signal B to the partner clock signal A, even when slow phase fluctuations occur in the partner clock signal A due to causes such as wandering of the external reference clock signal which is input to the active unit.

Figure 7:
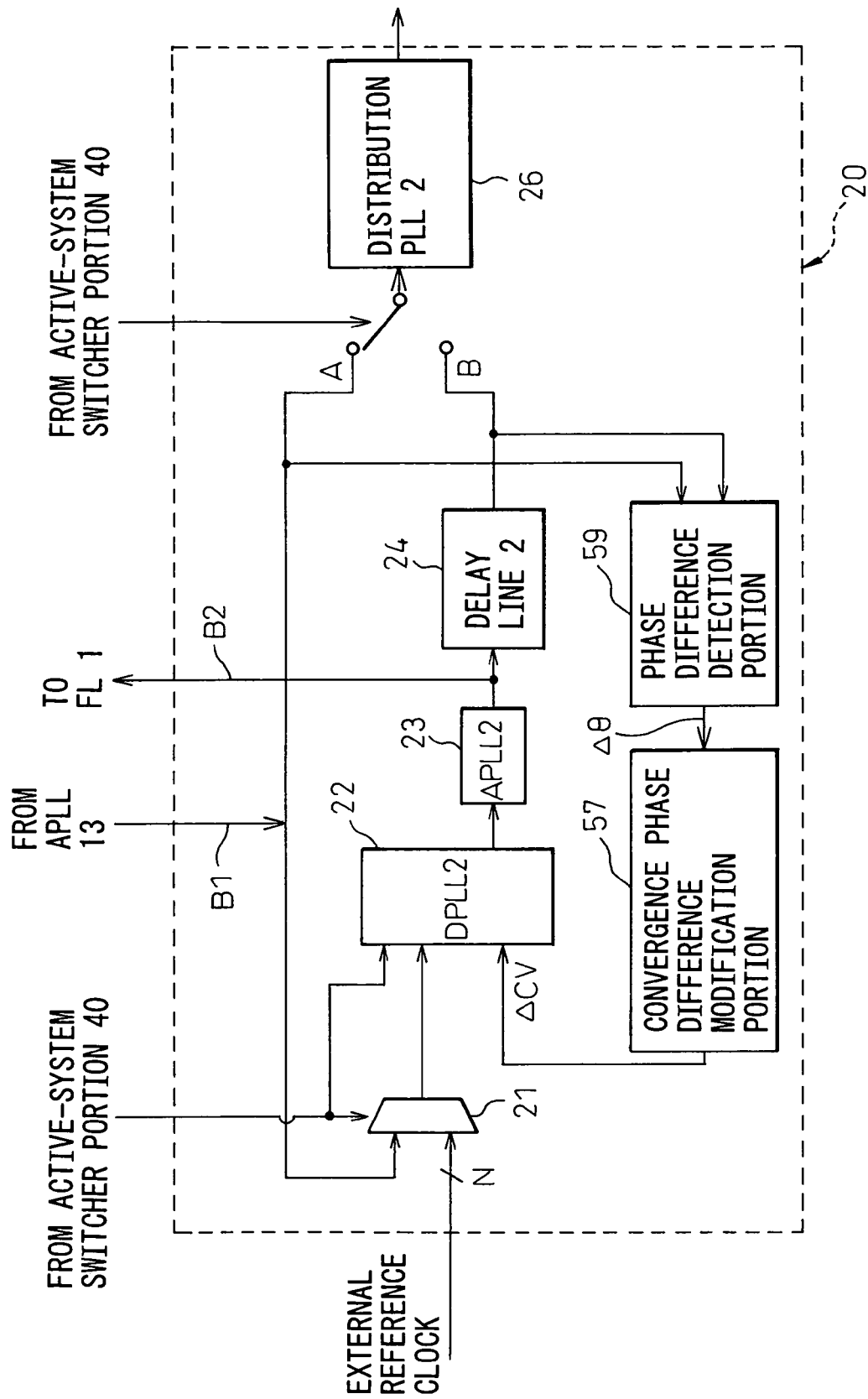
FIG. 7 is a block diagram of the basic configuration of a second embodiment of a system clock supply device in accordance with the present invention.
Figure 8:
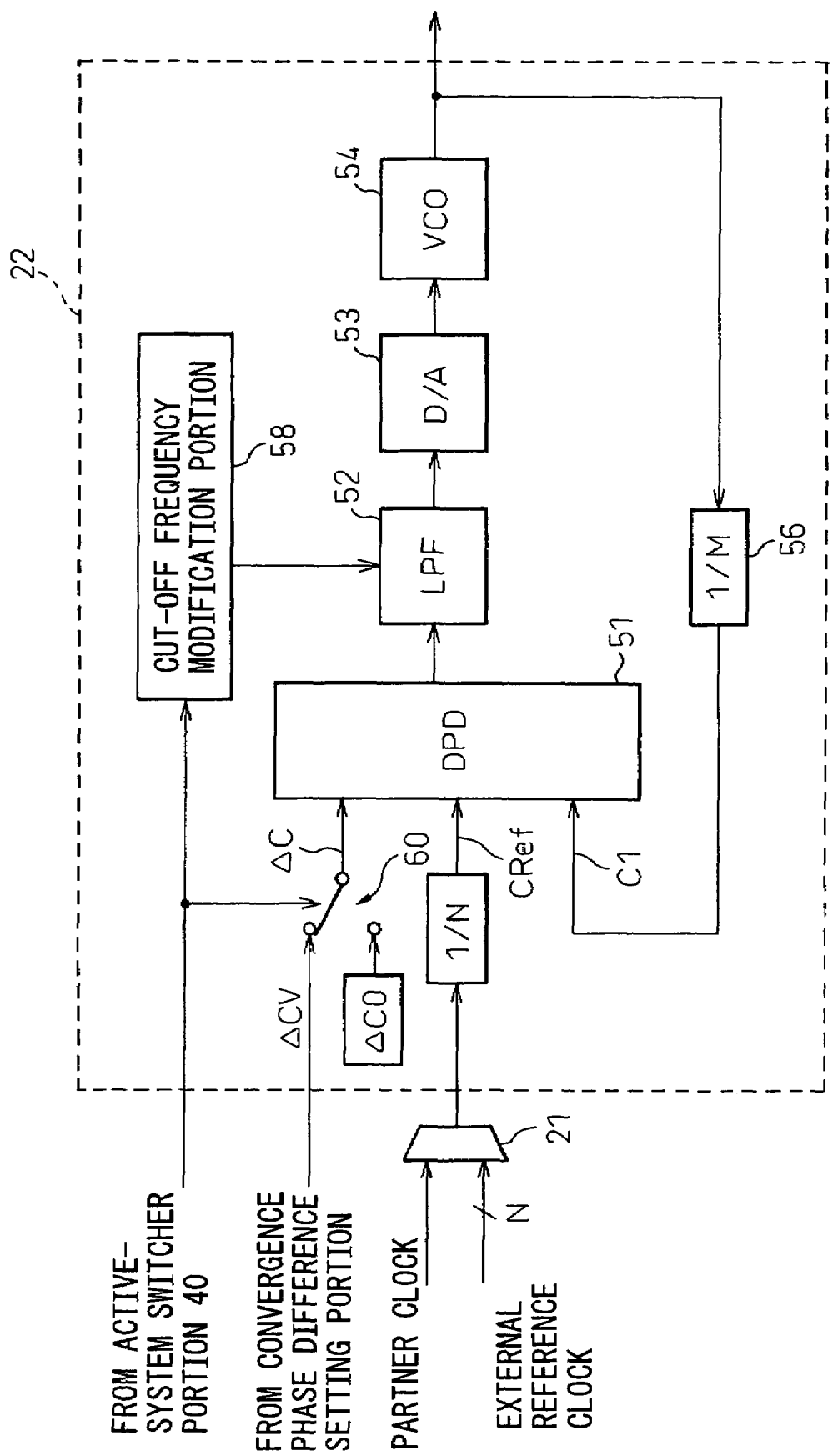
FIG. 8 is a block diagram of the basic configuration of the DPLL of FIG. 7.

A block diagram of the basic configuration of a clock supply unit which is a second embodiment of the system clock supply device in accordance with the present invention is shown in FIG. 7, and a block diagram of the basic configuration of the DPLL of FIG. 7 is shown in FIG. 8. Note that only the second clock supply unit 20 of the two clock supply units 10 and 20 of the system clock supply device 1 of FIG. 3 is shown in the figures, but the first clock supply unit 10 has a similar configuration.

When the second clock supply unit 20 is the standby unit in this embodiment, the phase difference between the delay clock signal B and the partner clock signal A is canceled by detecting the phase difference Δθ between the delay clock signal B and the partner clock signal A, modifying the convergence phase difference ΔCV of the DPD 51 such that the phase difference Δθ becomes smaller, and thus providing negative feedback control of the phase of the output clock signal of the APLL 23.

For that purpose, the second clock supply unit 20 comprises a phase difference detection portion 59 which detects the phase difference Δθ between the delay clock signal B and the partner clock signal A, together with the convergence phase difference modification portion 57 which modifies the convergence phase difference ACV such that the phase difference Δθ becomes smaller.

When the second clock supply unit 20 is the active unit, the convergence phase difference ΔC0 which was previously determined by the selector 60 is selected as the convergence phase difference for the DPD 51, whereas when the second clock supply unit 20 is the standby unit, the variable convergence phase difference ΔCV which is controlled by the convergence phase difference modification portion 57 is selected as the convergence phase difference for the DPD 51.

In the first embodiment in which ΔCV is a fixed value, a certain amount of phase difference is generated between the delay clock signal B and the partner clock signal A, due to variations in the delay of the various elements which make up the clock supply units 10 and 20, but this inconvenience is avoided by providing variable control of the convergence phase difference ΔCV while on standby, in response to the phase difference Δθ between the delay clock signal B and the partner clock signal A.

In a clock supply device having a redundant configuration provided by a plurality of clock supply units, this makes it possible to reduce phase fluctuations in the supplied clock signal which are created during the switching of the active unit.

The present invention can be used in a clock supply device which generates a reference clock for a transmission device such as an optical transmission device or mobile communications device which is provided in a digital synchronous network. In particular, the present invention can be used in a clock supply device which comprises a plurality of clock supply boards which generate clock signals based on an external reference clock which is supplied from an upper level of the digital synchronous network, where the redundant configuration thereof is due to those clock supply boards.

While the invention has been described with reference to specific embodiments chosen for purpose of illustration, it should be apparent that numerous modifications could be made thereto by those skilled in the art, without departing from the basic concept and scope of the invention.

What is claimed is:

1. A clock supply device having a redundant configuration which comprises a plurality of clock supply units each having a DPLL which generates a clock signal based on an external reference signal, such that one of said clock supply units acts as an active unit which supplies a clock signal generated by that clock supply unit to a later stage and another of said clock supply units acts as a standby unit;
    wherein each of said clock supply units comprises an inter-unit synchronization portion which operates when the unit is said standby unit, to cause synchronization of the output clock signal of the DPLL of the self unit to the output clock signal of the DPLL of said active unit, with a predetermined phase difference therebetween, with reference to a clock signal from the DPLL of said active unit which is input from said active unit.

2. The clock supply device as set forth in claim 1, wherein said DPLL comprises:
    a phase comparison portion which outputs a difference signal between a specified convergence phase difference and a phase difference, wherein the latter phase difference is a difference between the phase of an input reference clock signal and the phase of the output clock signal of said DPLL;
    an oscillation portion which generates a clock signal to be output by said DPLL, while varying the frequency of said clock signal such that the value of the difference signal becomes smaller;
    and wherein said inter-unit synchronization portion comprises:
    a clock signal switching portion which operates when the unit is said standby unit, to switch the reference clock signal which is input to said DPLL from an external reference clock signal to a clock signal which is input from said active unit; and
    a convergence phase difference modification portion which modifies a specified value of said convergence phase difference when the reference clock signal which is input to said DPLL is switched.

3. The clock supply device as set forth in claim 2, wherein said convergence phase difference modification portion selects a specified value of said convergence phase difference from a plurality of different fixed values which were determined previously.

4. The clock supply device as set forth in claim 2, wherein said clock supply unit comprises:
    a supply clock selection portion which selects either the clock signal from the DPLL of the unit or a clock signal which is input from said active unit, as a clock signal to be output to the exterior; and
    a phase difference detection portion which detects an output phase difference which is the phase difference between the clock signal from the DPLL of the unit and a clock signal which is input from said active unit;
    and wherein said convergence phase difference modification portion modifies the specified value of said convergence phase difference such that said output phase difference becomes smaller.

5. The clock supply device as set forth in claim 1, wherein said clock supply unit further comprises a cut-off frequency modification portion which increases the cut-off frequency of the DPLL of said unit when said unit is acting as said standby unit to greater than that when said unit is acting as said active unit.

* * * * *